(12) United States Patent
Shen et al.

(10) Patent No.: US 10,808,519 B2
(45) Date of Patent: Oct. 20, 2020

(54) ELECTRICAL ASSEMBLY SUBSTRATES FOR DOWNHOLE USE

(71) Applicant: Baker Hughes, a GE company, LLC, Houston, TX (US)

(72) Inventors: Zhenzhen Shen, Houston, TX (US); Aleksey Reiderman, Houston, TX (US)

(73) Assignee: BAKER HUGHES HOLDINGS LLC, Houston, TX (US)

( * ) Notice: Subject to any disclaimer, the term of this patent is extended or adjusted under 35 U.S.C. 154(b) by 267 days.

(21) Appl. No.: 15/962,893

(22) Filed: Apr. 25, 2018

(65) Prior Publication Data

US 2019/0330972 A1 Oct. 31, 2019

(51) Int. Cl.
*E21B 47/01* (2012.01)
*H01L 21/768* (2006.01)
*H01L 21/02* (2006.01)
*H01L 23/00* (2006.01)

(Continued)

(52) U.S. Cl.
CPC ........ *E21B 47/01* (2013.01); *H01L 21/02266* (2013.01); *H01L 21/02425* (2013.01); *H01L 21/76841* (2013.01); *H01L 24/32* (2013.01); *H01L 24/48* (2013.01); *H05K 1/181* (2013.01); *H05K 3/4644* (2013.01);

(Continued)

(58) Field of Classification Search
CPC .............. E21B 47/01; H01L 21/02266; H01L 21/02425; H01L 21/76841; H01L 24/32; H01L 21/48; H01L 2924/01047; H01L 2924/0105; H01L 2924/01079; H05K 1/181; H05K 3/4644

USPC ........................................................ 340/853.1
See application file for complete search history.

(56) References Cited

U.S. PATENT DOCUMENTS

| 4,095,865 A * | 6/1978 | Denison ................ E21B 17/003 |
| | | 340/855.2 |
| 4,847,732 A | 7/1989 | Stopper et al. |

(Continued)

FOREIGN PATENT DOCUMENTS

KR 1020100080123 7/2010

OTHER PUBLICATIONS

Hampy, R. "A Versatile Ta2N—W—Au/SiO2/Al/SiO2Thin Film Microcircuit Metallization System," IEEE Transactionson Parts, Hybrids and Packaging, vol. PHP-11, No. 4, Dec. 1975.

(Continued)

*Primary Examiner* — Ojiako K Nwugo
(74) *Attorney, Agent, or Firm* — Mossman Kumar & Tyler PC

(57) ABSTRACT

Methods, systems, devices, and products for performing well logging in a borehole intersecting an earth formation. Apparatus include a carrier conveyable in the borehole; a tool disposed on the carrier. The tool comprises a substrate including a first attachment interface electrically connected to a second attachment interface by a substrate connection element, wherein the first attachment interface comprises a first attachment interface material and the second attachment interface comprises a second attachment interface material different than the first attachment interface material; and at least two terminals, each terminal attached to at least one of the first attachment interface material of the substrate and the second attachment interface material of the substrate by a join.

18 Claims, 5 Drawing Sheets

(51) Int. Cl.
*H05K 3/46* (2006.01)
*H05K 1/18* (2006.01)

(52) U.S. Cl.
CPC .............. *H01L 2924/0105* (2013.01); *H01L 2924/01047* (2013.01); *H01L 2924/01079* (2013.01)

(56) References Cited

U.S. PATENT DOCUMENTS

| | | |
|---|---|---|
| 5,330,364 A * | 7/1994 | Mount, II ............ G01V 11/002 340/855.1 |
| 6,160,276 A | 12/2000 | Mohsen |
| 9,024,453 B2 | 5/2015 | Sidhu et al. |
| 2004/0124509 A1 | 7/2004 | Kim et al. |
| 2008/0036098 A1 | 2/2008 | Kovats et al. |
| 2010/0207150 A1* | 8/2010 | Grajcar ................ H01L 33/483 257/98 |
| 2016/0057853 A1 | 2/2016 | Zacharko et al. |
| 2016/0258272 A1 | 9/2016 | Bonavides et al. |
| 2017/0076979 A1 | 3/2017 | Hollis |
| 2017/0152735 A1 | 6/2017 | Tao |
| 2018/0042111 A1 | 2/2018 | Difoggio et al. |

OTHER PUBLICATIONS

PCT/US2019/029182—International Search Report dated Apr. 25, 2019.

\* cited by examiner

ELECTRICAL ASSEMBLY SUBSTRATES FOR DOWNHOLE USE

FIELD OF THE DISCLOSURE

In one aspect, this disclosure relates generally to borehole tools, and in particular to tools used for drilling a borehole in an earth formation.

BACKGROUND OF THE DISCLOSURE

Drilling wells for various purposes is well-known. Such wells may be drilled for geothermal purposes, to produce hydrocarbons (e.g., oil and gas), to produce water, and so on. Well depth may range from a few thousand feet to 25,000 feet or more. Downhole tools often incorporate various sensors, instruments and control devices in order to carry out any number of downhole operations. Thus, the tools may include sensors and/or electronics for formation evaluation, fluid analysis, monitoring and controlling the tool itself, and so on. Tools typically include one or more printed circuit boards having electrical components attached.

SUMMARY OF THE DISCLOSURE

In aspects, the present disclosure is related to methods and apparatus for performing well logging in a borehole intersecting an earth formation. Apparatus may include a carrier conveyable in the borehole; and a tool disposed on the carrier. The tool may comprise a substrate including a first attachment interface electrically connected to a second attachment interface by a substrate connection element, wherein the first attachment interface comprises a first attachment interface material and the second attachment interface comprises a second attachment interface material different than the first attachment interface material; and at least two circuit elements selected from a circuit element comprising: i) a terminal of a Gold (Au) terminal material electrically attached to at least one of the first attachment interface material of the substrate and the second attachment interface material of the substrate by a AuSn solder join; ii) a terminal of a Silver (Ag) terminal material electrically attached to at least one of the first attachment interface material of the substrate and the second attachment interface material of the substrate by a high melting point (HMP) Sn/Ag based solder join; iii) a terminal of a Tin (Sn) terminal material electrically attached to at least one of the first attachment interface material of the substrate and the second attachment interface material of the substrate by a HMP Sn/Ag based solder join; iv) a terminal of a Silver (Ag) terminal material electrically attached to at least one of the first attachment interface material of the substrate and the second attachment interface material of the substrate by a sintered Ag join.

At least one of the first attachment interface and the second attachment interface may comprise an electrically conductive contact surface, e.g., a pad. For at least one circuit element of the at least two circuit elements, the circuit element terminal corresponding to the at least one circuit element may be monometallic with the attachment interface corresponding to the at least one circuit element. For at least one circuit element of the at least two circuit elements, the join corresponding to the at least one circuit element may be an electrically conductive join that is monometallic with the attachment interface corresponding to the at least one circuit element and the circuit element terminal corresponding to the at least one circuit element.

The substrate connection element may comprise an additional conductor material different than the first attachment interface material and the second attachment interface material. The additional conductor material may be at least one of: i) multi-metallic; and ii) composite. The substrate may comprise a sequential physical vapor deposition material having deposition layers comprising at least one adhesion layer, at least one barrier layer, and at least one conductor layer.

The substrate may comprise a first Tungsten-Titanium layer, a second Tungsten-Titanium layer, a Palladium layer, and a Gold layer between the Palladium layer and at least one of: i) the first Tungsten-Titanium layer, and ii) a second Tungsten-Titanium layer. The substrate may comprise a first Tungsten-Titanium layer, a second Tungsten-Titanium layer, a Titanium layer, and an Aluminum layer between the Titanium layer and at least one of: i) the first Tungsten-Titanium layer, and ii) a second Tungsten-Titanium layer.

The substrate may comprise deposited layers including a first Titanium layer followed by a first Tungsten-Titanium barrier layer followed by a Palladium layer followed by a Gold layer followed by a second Tungsten-Titanium barrier layer followed by a second Titanium layer followed by an Aluminum layer followed by a third Tungsten-Titanium barrier layer followed by a third Titanium layer followed by a Nickel layer followed by a Silver layer.

Another apparatus may include a carrier conveyable in the borehole; and a tool disposed on the carrier comprising: a substrate including a first attachment interface electrically connected to a second attachment interface by a substrate connection element, wherein the first attachment interface comprises a first attachment interface material and the second attachment interface comprises a second attachment interface material different than the first attachment interface material; and at least two circuit elements selected from circuit elements comprising: i) a Gold (Au) terminal material electrically monometallically attached to at least one of the first attachment interface material of the substrate and the second attachment interface material of the substrate by Au wire; ii) an Aluminum (Al) terminal material electrically monometallically attached to at least one of the first attachment interface material of the substrate and the second attachment interface material of the substrate by Al wire; iii) a Silver (Ag) terminal material electrically monometallically attached to at least one of the first attachment interface material of the substrate and the second attachment interface material of the substrate by Ag wire.

Examples of some features of the disclosure may be summarized rather broadly herein in order that the detailed description thereof that follows may be better understood and in order that the contributions they represent to the art may be appreciated.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein.

DETAILED DESCRIPTION

Figure 1A:
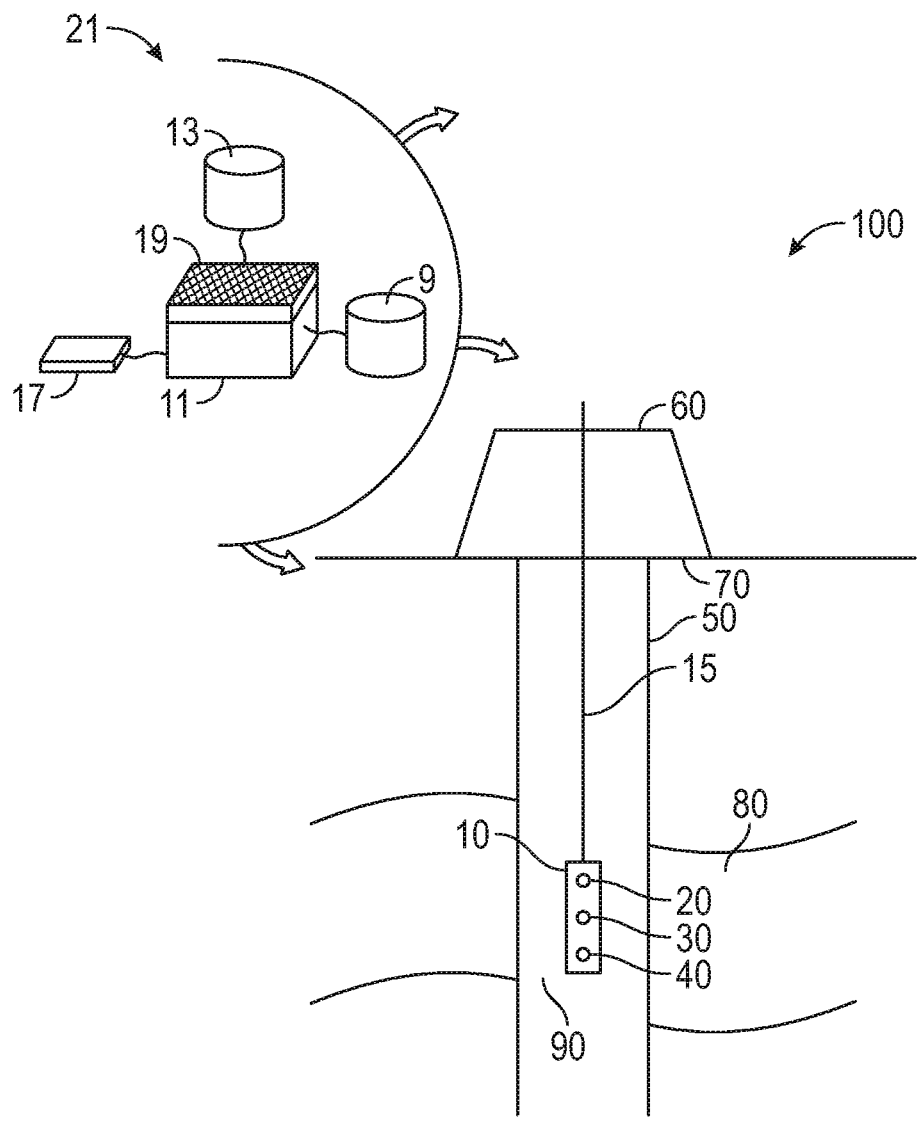
FIG. 1A schematically illustrates a system having a downhole tool configured to acquire information in a borehole intersecting a volume of interest of an earth formation for estimating parameters of interest of the formation.

Aspects of the present disclosure relate to improvements in printed circuit boards for use downhole. Aspects include apparatus for drilling boreholes and downhole logging including one or more printed circuit boards adapted for the rigors of this application.

Traditional printed circuit boards have been around for many decades as one common electrical assembly manufacturing solution. Conventionally, solder is used as the primary method of attaching electrical components (e.g., integrated circuits (ICs)) to the printed circuit board (PCB). A printed circuit board (PCB) is a plate or board comprising a substrate supporting different elements that make up an electrical circuit that contains the electrical interconnections between them. Together, upon assembly, the components (including one or more PCBs) making up the electrical circuit is referred to herein collectively as an electrical assembly (EA). As one example, downhole tools and sensors may use an integrated circuit (IC) that integrates all components of a computer or other electronic system into a single chip, referred to herein as a system on a chip (SoC or SOC) as a high level of functional spatial integration into a complex integrated circuit. The SoC may contain digital, analog, mixed-signal, and/or radio-frequency functions—on a single chip substrate. It is also possible to incorporate multiple SoC modules mounted with other substrates containing electrical components.

One or more Multiple Chip Modules (MCM) may integrate electrical assemblies completed entirely or partially in a previous step in the manufacturing process. ICs integrated into the Electrical Assembly (EA) could have been manufactured with various spatial integration level technologies such as Large Scale Integration (LSI), Very Large Scale Integration (VLSI) or Ultra Large Scale Integration (ULSI).

Measurement-while-drilling and logging-while-drilling (MWD/LWD) tools experience demanding conditions, including elevated levels of vibration, shock, and heat. Thus, a robust electrical connection is quite beneficial.

Vibration and shock experienced by the components of a MWD/LWD tool may reach levels of greater than 50 times the force of gravity (gravitational units, g). Severe downhole vibrations can damage drilling equipment including the drill bit, drill collars, stabilizers, MWD/LWD, and Rotary Steerable System (RSS).

Multi-chip modules and other assemblies may include components and multiple bare silicon die interconnected by bond wires and attached to substrates with metal conductors. Methods may include permanently electrically coupling the electrical component to the printed circuit board by laser welding or sintering. Components, die, and bond wire metals are usually different materials. For example assemblies may include Gold (Au) metalized resistors and capacitors, Silver (Ag) metallized die, aluminum (Al) bond wire, and so on. For reliable operation at extreme temperatures all connections need to be made to matching materials. The connections may be made using the same metals in order to eliminate interfacial weakening of joins due to diffusion of dissimilar metals and formation of intermetallic compounds. However, common MCM substrates metallization consist of either Au, or Ag, or Ag/Pd, or Ni/Au metals. Mixture of these metals lead to diffusion and formation of unreliable intermetallic compounds at high temperatures. Universal metallizations like Ag/Pd or Ag/Pt have low electrical conductivity, and thus not preferred for substrate conductors. It may be more desirable to employ significantly electrically conductive materials.

Aspects of the disclosure may include a substrate providing simultaneously all the matching metallization types in a multi-chip module (e.g., gold pads for gold bond wire or gold termination components and die; silver pads for silver bond wire or silver termination components and die; aluminum pads for aluminum bond wire; etc.), which mitigates these challenges. Multi-metal substrates proposed in this application may be built by properly sequenced physical vapor deposition of adhesion, barrier, and conductor metals with thicknesses that ensure reliable monometallic attachment interfaces.

In aspects, the present disclosure includes an apparatus for performing well logging in a borehole intersecting an earth formation. The apparatus may include a carrier conveyable in the borehole and a tool (e.g., logging instrument) disposed on the carrier. The tool may include a substrate including a first attachment interface electrically connected to a second attachment interface by an intermediary circuit path, wherein the first attachment interface comprises a first conductor material and the second attachment interface comprises a second conductor material different than the first conductor material. The intermediary circuit path may be a substrate connection element, such as a via or other interconnect.

Techniques described herein are particularly suited for use in measurement of values of properties of a formation downhole or of a downhole fluid while drilling, through the use of instruments which may utilize PCBs as described herein. These values may be used to evaluate and model the formation, the borehole, and/or the fluid, and for conducting further operations in the formation or the borehole.

FIG. 1A schematically illustrates a system 100 having a downhole tool 10 configured to acquire information in a borehole 50 intersecting a volume of interest of an earth formation 80 for estimating density, oil saturation, and/or other parameters of interest of the formation 80. The parameters of interest may include information relating to a geological parameter, a geophysical parameter, a petrophysical parameter, and/or a lithological parameter. Thus, the tool 10 may include sensors 20, 30 and 40 for detecting physical phenomena indicative of a parameter of interest. Sensors 20, 30 and 400 may include sensors for estimating formation resistivity, dielectric constant, the presence or absence of hydrocarbons, acoustic density, bed boundary, formation density, nuclear density and certain rock characteristics, permeability, capillary pressure, and relative permeability.

The system 100 may include a conventional derrick 60 and a conveyance device (or carrier) 15, which may be rigid or non-rigid, and may be configured to convey the downhole tool 10 into wellbore 50 in proximity to formation 80. The carrier 15 may be a drill string, coiled tubing, a slickline, an e-line, a wireline, etc. Downhole tool 10 may be coupled or combined with additional tools. Thus, depending on the configuration, the tool 10 may be used during drilling and/or after the borehole (wellbore) 50 has been formed. While a land system is shown, the teachings of the present disclosure may also be utilized in offshore or subsea applications. The carrier 15 may include embedded conductors for power and/or data for providing signal and/or power communication between the surface and downhole equipment. The carrier 15 may include a bottom hole assembly, which may include a drilling motor for rotating a drill bit. Drilling fluid 90 may be present between the formation 80 and the downhole tool 10.

Certain embodiments of the present disclosure may be implemented with a hardware environments that includes an information processor 11, an information storage medium 13, an input device 17, processor memory 19, and may include peripheral information storage medium 9. The hardware environments may be in the well, at the rig, or at a remote location. Moreover, the several components of the hardware environments may be distributed among those locations. The input device 17 may be any data reader or user input device, such as data card reader, keyboard, USB port, etc. The information storage medium 13 stores information provided by the detectors. Information storage medium 13 may include any non-transitory computer-readable medium for standard computer information storage, such as a USB drive, memory stick, hard disk, removable RAM, EPROMs, EAROMs, flash memories and optical disks or other commonly used memory storage system known to one of ordinary skill in the art including Internet based storage. Information storage medium 13 stores a program that when executed causes information processor 11 to execute the disclosed method. Information storage medium 13 may also store the formation information provided by the user, or the formation information may be stored in a peripheral information storage medium 9, which may be any standard computer information storage device, such as a USB drive, memory stick, hard disk, removable RAM, or other commonly used memory storage system known to one of ordinary skill in the art including Internet based storage. Information processor 11 may be any form of computer or mathematical processing hardware, including Internet based hardware. When the program is loaded from information storage medium 13 into processor memory 19 (e.g. computer RAM), the program, when executed, causes information processor 11 to retrieve detector information from either information storage medium 13 or peripheral information storage medium 9 and process the information to estimate a parameter of interest. Information processor 11 may be located on the surface or downhole.

The term "information" as used herein includes any form of information (analog, digital, EM, printed, etc.). As used herein, a processor is any information processing device that transmits, receives, manipulates, converts, calculates, modulates, transposes, carries, stores, or otherwise utilizes information. In several non-limiting aspects of the disclosure, an information processing device includes a computer that executes programmed instructions for performing various methods. These instructions may provide for equipment operation, control, data collection and analysis and other functions in addition to the functions described in this disclosure. The processor may execute instructions stored in computer memory accessible to the processor, or may employ logic implemented as field-programmable gate arrays ('FPGAs'), application-specific integrated circuits ('ASICs'), other combinatorial or sequential logic hardware, and so on.

In other embodiments, such electronics may be located elsewhere (e.g., at the surface, or remotely). To perform the measurement during a single trip, the tool may use a high bandwidth transmission to transmit the information acquired by sensor array 30 to the surface for analysis. For instance, a communication line for transmitting the acquired information may be an optical fiber, a metal conductor, or any other suitable signal conducting medium. It should be appreciated that the use of a "high bandwidth" communication line may allow surface personnel to monitor and control the measurement activity in "real time." Each of the components described above may be implemented as one or more electrical components, such as integrated circuits (ICs), operatively connected via a circuit board in accordance with techniques of the present disclosure.

Figure 1B:
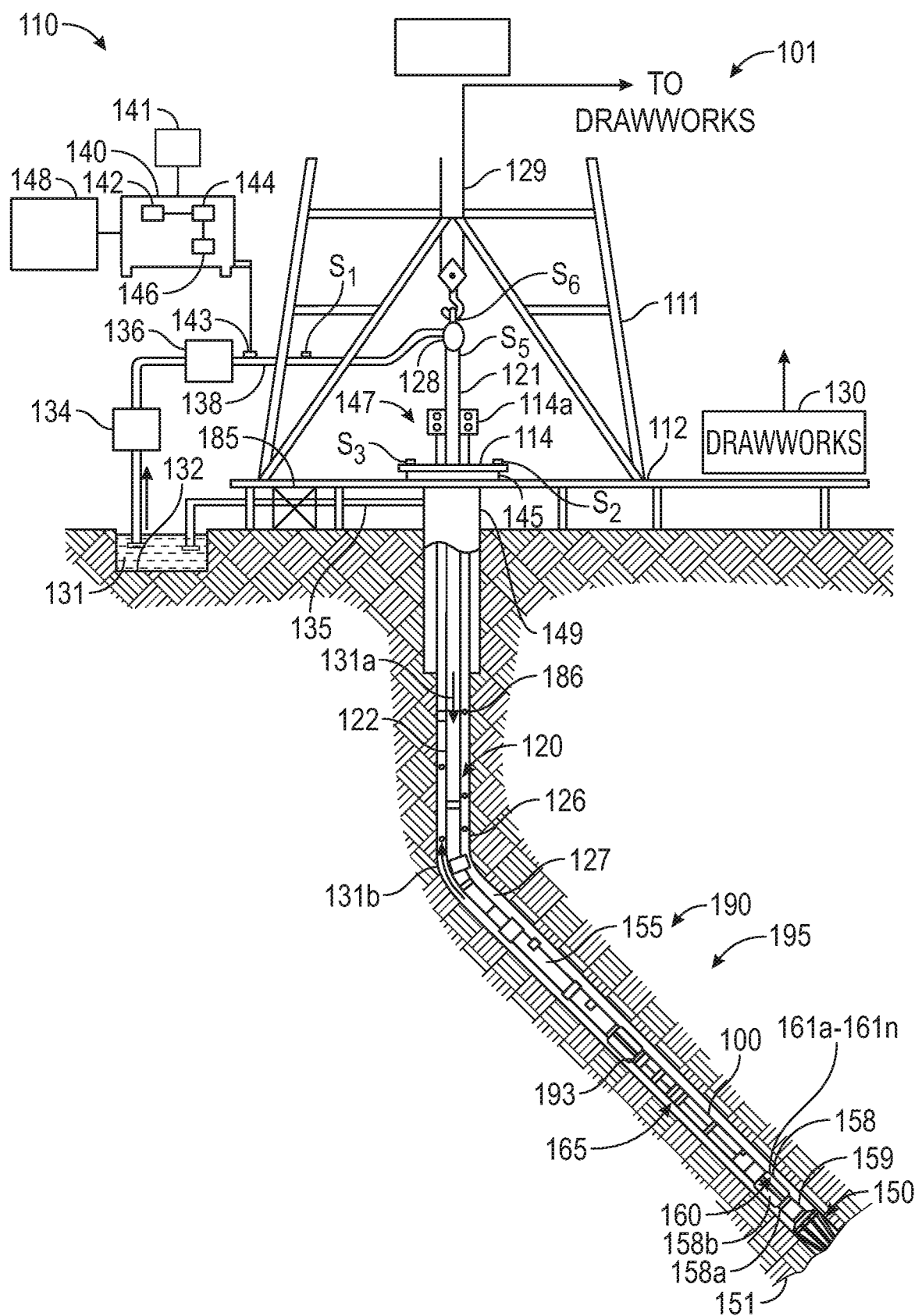
FIG. 1B shows an exemplary embodiment of an MWD system for evaluation of an earth formation using measurements from a well logging tool.

Aspects of the present disclosure are subject to application in various different embodiments. In some general embodiments, carrier 15 is implemented as a tool string of a drilling system, and measurements taken in the borehole may be characterized as "logging-while-drilling" (LWD) or "measurement-while-drilling" (MWD) operations. FIG. 1B shows an exemplary embodiment of an MWD system for evaluation of an earth formation using measurements from a well logging tool. The system 101 includes a carrier 111 that is shown disposed in a wellbore or borehole 126 that penetrates at least one earth formation 195.

FIG. 1B shows a drill string 120 including a bottomhole assembly (BHA) 190 conveyed in the borehole 126 as the carrier. The drilling system 101 includes a conventional derrick 111 erected on a platform or floor 112 which supports a rotary table 114 that is rotated by a prime mover, such as an electric motor (not shown), at a desired rotational speed. A tubing (such as jointed drill pipe 122), having the drilling assembly 190, attached at its bottom end extends from the surface to the bottom 151 of the borehole 126. A drill bit 150, attached to drilling assembly 190, disintegrates the geological formations when it is rotated to drill the borehole 126. The drill string 120 is coupled to a drawworks 130 via a Kelly joint 121, swivel 128 and line 129 through a pulley. Drawworks 130 is operated to control the weight on bit ("WOB"). The drill string 120 may be rotated by a top drive (not shown) instead of by the prime mover and the rotary table 114. Alternatively, a coiled-tubing may be used as the tubing 122. A tubing injector 114a may be used to convey the coiled-tubing having the drilling assembly attached to its bottom end. The operations of the drawworks 130 and the tubing injector 114a are known in the art and are thus not described in detail herein.

A suitable drilling fluid 131 (also referred to as the "mud") from a source 132 thereof, such as a mud pit, is circulated under pressure through the drill string 120 by a mud pump 134. The drilling fluid 131 passes from the mud pump 134 into the drill string 120 via a discharger 136 and the fluid line 138. The drilling fluid 131a from the drilling tubular discharges at the borehole bottom 151 through openings in the drill bit 150. The returning drilling fluid 131b circulates uphole through the annular space 127 between the drill string 120 and the borehole 126 and returns to the mud pit 132 via a return line 135 and drill cutting screen 185 that removes the drill cuttings 186 from the returning drilling fluid 131b. A sensor S1 in line 138 provides information about the fluid flow rate. A surface torque sensor S2 and a sensor S3 associated with the drill string 120 respectively provide information about the torque and the rotational speed of the drill string 120. Tubing injection speed is determined from the sensor S5, while the sensor S6 provides the hook load of the drill string 120.

In some applications, the drill bit 150 is rotated by only rotating the drill pipe 122. However, in many other applications, a downhole motor 155 (mud motor) disposed in the BHA 190 also rotates the drill bit 150. The rate of penetration (ROP) for a given BHA largely depends on the WOB or the thrust force on the drill bit 150 and its rotational speed.

A surface control unit or controller 140 receives signals from the downhole sensors and devices via a sensor 143 placed in the fluid line 138 and signals from sensors S1-S6 and other sensors used in the system 101 and processes such signals according to programmed instructions provided to the surface control unit 140. The surface control unit 140 displays drilling parameters and other parameters of interest related to the borehole, formation, and drilling operations, and other information on a display/monitor 141 that is utilized by an operator to control the drilling operations. The surface control unit 140 may be a computer-based unit that may include a processor 142 (such as a microprocessor), a storage device 144, such as a solid-state memory, tape or hard disc, and one or more computer programs 146 in the storage device 144 that are accessible to the processor 142 for executing instructions contained in such programs. The surface control unit 140 may further communicate with a remote control unit 148. The surface control unit 140 may process data relating to the drilling operations, data from the sensors and devices on the surface, and data received from downhole; and may control one or more operations of the downhole and surface devices. The data may be transmitted in analog or digital form.

The BHA 190 may include a tool 110 configured for performing well logging measurements. The BHA 190 may also contain other formation evaluation sensors or devices (also referred to as measurement-while-drilling ("MWD") or logging-while-drilling ("LWD") sensors) determining resistivity, density, porosity, permeability, acoustic properties, nuclear-magnetic resonance properties, formation pressures, properties or characteristics of the fluids downhole and other desired properties of the formation 195 surrounding the BHA 150. For convenience, all such sensors are generally denoted herein by numeral 165. The BHA 190 may further include a variety of other sensors and devices 159 for determining one or more properties of the BHA 190, such as vibration, bending moment, acceleration, oscillations, whirl, stick-slip, weight-on-bit, fluid flow rate, pressure, temperature, rate of penetration, azimuth, tool face, drill bit rotation, etc.

The BHA 190 may include a steering apparatus or tool 158 for steering the drill bit 50 along a desired drilling path. In one aspect, the steering apparatus may include a steering unit 160, having a number of force application members 161a-161n. The force application members may be mounted directly on the drill string, or they may be at least partially integrated into the drilling motor. In another aspect, the force application members may be mounted on a sleeve, which is rotatable about the center axis of the drill string. The force application members may be activated using electro-mechanical, electro-hydraulic or mud-hydraulic actuators. In yet another embodiment the steering apparatus may include a steering unit 158 having a bent sub and a first steering device 158a to orient the bent sub in the wellbore and the second steering device 158b to maintain the bent sub along a selected drilling direction. The steering unit 158, 160 may include near-bit inclinometers and magnetometers.

The drilling system 101 may include sensors, circuitry and processing software and algorithms for providing information about desired drilling parameters relating to the BHA, drill string, the drill bit and downhole equipment such as a drilling motor, steering unit, thrusters, etc. Many current drilling systems, especially for drilling highly deviated and horizontal wellbores, utilize coiled-tubing for conveying the drilling assembly downhole. In such applications a thruster may be deployed in the drill string 120 to provide the required force on the drill bit.

Exemplary sensors for determining drilling parameters include, but are not limited to drill bit sensors, an RPM sensor, a weight on bit sensor, sensors for measuring mud motor parameters (e.g., mud motor stator temperature, differential pressure across a mud motor, and fluid flow rate through a mud motor), and sensors for measuring acceleration, vibration, whirl, radial displacement, stick-slip, torque, shock, vibration, strain, stress, bending moment, bit bounce, axial thrust, friction, backward rotation, BHA buckling, and radial thrust. Sensors distributed along the drill string can measure physical quantities such as drill string acceleration and strain, internal pressures in the drill string bore, external pressure in the annulus, vibration, temperature, electrical and magnetic field intensities inside the drill string, bore of the drill string, etc. Suitable systems for making dynamic downhole measurements include COPILOT, a downhole measurement system, manufactured by BAKER HUGHES INCORPORATED.

The drilling system 101 can include one or more downhole processors at a suitable location such as 193 on the BHA 190. The processor(s) can be a microprocessor that uses a computer program implemented on a suitable non-transitory computer-readable medium that enables the processor to perform the control of system 101 and processing of information, such as information from the sensors. The non-transitory computer-readable medium may include one or more ROMs, EPROMs, EAROMs, EEPROMs, flash memories, RAMs, hard drives and/or optical disks. Other equipment such as power and data buses, power supplies, and the like will be apparent to one skilled in the art. In one embodiment, the MWD system utilizes mud pulse telemetry to communicate data from a downhole location to the surface while drilling operations take place. The surface processor 142 can process the surface measured data, along with the data transmitted from the downhole processor, to evaluate the formation.

Surface processor 142 or downhole processor 193 may also be configured to control steering apparatus 158, mud pump 134, drawworks 130, rotary table 114, downhole motor 155, other components of the BHA 190, or other components of the drilling system 101. Surface processor 142 or downhole processor 193 may be configured to control sensors described above and to estimate a parameter of interest according to methods described herein.

Control of these components may be carried out using one or more models using methods described below. For example, surface processor 142 or downhole processor 193 may be configured to modify drilling operations i) autonomously upon triggering conditions, ii) in response to operator commands, or iii) combinations of these. Such modifications may include changing drilling parameters, steering the drillbit (e.g., geosteering), altering the drilling fluid program, activating well control measures, and so on. Control of these devices, and of the various processes of the drilling system generally, may be carried out in a completely automated fashion or through interaction with personnel via notifications, graphical representations, user interfaces and the like. Reference information accessible to the processor may also be used. In some general embodiments, surface processor 142, downhole processor 193, or other processors (e.g. remote processors) may be configured to operate the well logging tool 110 to make well logging measurements. Each of these logical components of the drilling system may be implemented as one or more electrical components, such as integrated circuits (ICs), operatively connected via a circuit board in accordance with techniques of the present disclosure.

The system 101 may include any number of downhole tools for various processes including formation drilling, geosteering, and formation evaluation (FE) for making measurements versus depth and/or time of one or more physical properties in or around a borehole, including a volume of interest of the formation intersected by the borehole. The tool 110 may be included in or embodied as a BHA, drillstring component or other suitable carrier.

While a drill string 120 is shown as a conveyance device for tool 110, it should be understood that embodiments of the present disclosure may be used in connection with tools conveyed via rigid (e.g. jointed tubular or coiled tubing) as well as non-rigid (e. g. wireline, slickline, e-line, etc.) conveyance systems. The drilling system 101 may include a bottomhole assembly and/or sensors and equipment for implementation of embodiments of the present disclosure on either a drill string or a wireline.

Mitigation of Electrical Connectivity Failure

General embodiments of the present disclosure may include a tool for performing well logging in a borehole intersecting an earth formation. The tool may include a printed circuit board used in operation of the tool.

Figure 2A:
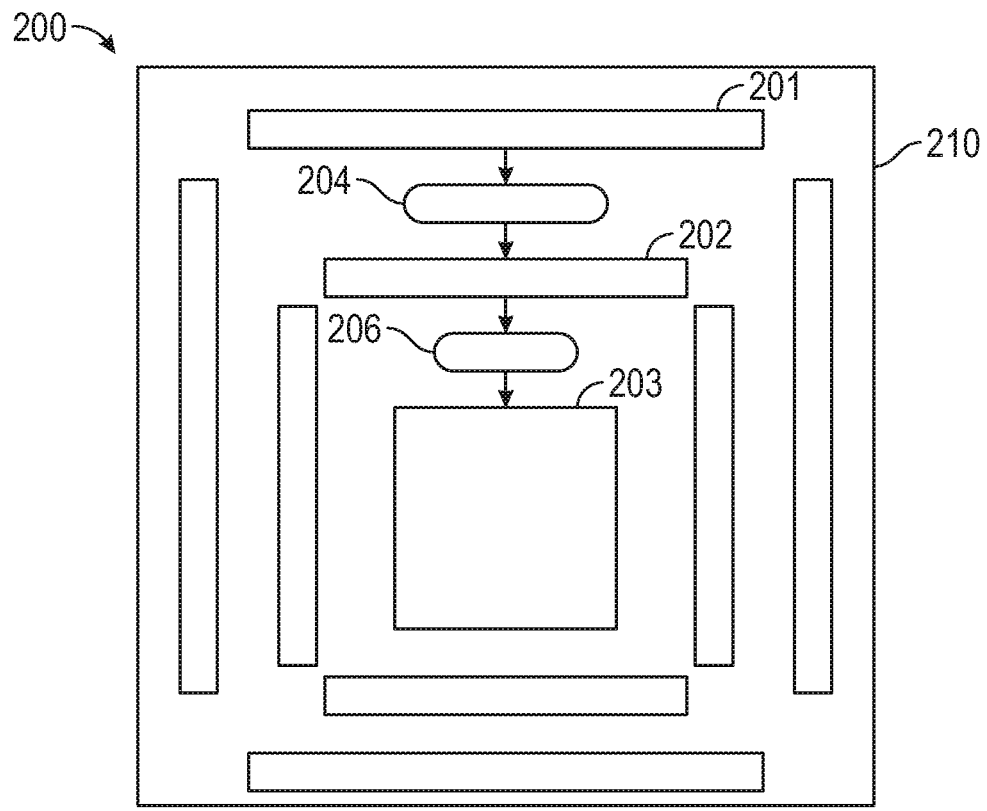
FIG. 2A illustrates a schematic view of a substrate including attachment interfaces electrically connected by intermediary circuit paths.

FIG. 2A illustrates a schematic view of a substrate including attachment interfaces electrically connected by intermediary circuit paths. The substrate 210 of FIG. 2A comprises a first attachment interface 201, a second attachment interface 202, and optionally a third attachment interface 203. At least one of the first attachment interface and the second attachment interface comprises an electrically conductive contact surface, such as, for example, a pad.

The first attachment interface 201 comprises a first attachment interface material and a second attachment interface 202 comprises a second attachment interface material different than the first. At least one of the electrically conductive contact surfaces described above may be monometallic. The attachment interface material may be a standard conductor material. The first attachment interface 201 is electrically connected to the second attachment interface 202 by a substrate connection element 204. The third attachment interface 203 may be connected to the second attachment interface 202 by a substrate connection element 206.

Figure 2B:
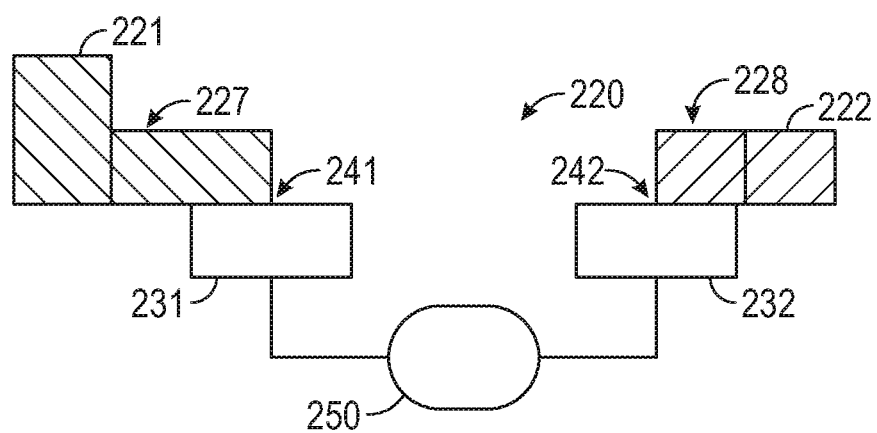
FIG. 2B illustrates a schematic view of an electrical assembly (EA) including attachment interfaces electrically connected by intermediary circuit paths.

FIG. 2B illustrates a schematic view of an electrical assembly (EA) including attachment interfaces electrically connected by intermediary circuit paths. The operative coupling at each end of the board's circuit path may be implemented via a circuit element (243, 247) including a connector (e.g., a terminal) attached to the attachment interface material by a join. The assembly may functionally operatively connect a number of electrical components, and the respective connector may be integrated with a corresponding component. Thus, the circuit element may include the component, the connector, the attachment interface, and the join(s).

The electrical assembly (EA) 220 includes a first component 221 and a second component 222 electrically operatively coupled. In one example, a first attachment interface 231 is electrically connected to a second attachment interface 232 by substrate connection element 250. The first component 221 has a first connector 227 of a corresponding conductor material permanently electrically coupled to the first attachment interface 231 by a first electrical join 241.

The second component 222 has a second connector 228 of a corresponding conductor material permanently electrically coupled to the second attachment interface 232 by a second electrical join 242. The corresponding conductor materials are respectively configured for joining with the first and second attachment interface materials for unimpeded electrical coupling.

As described above, each circuit element may include an attachment interface of a particular attachment interface material joined to connector, which may also be a variety of materials. The join itself may be implemented using various techniques. For example, the first join may be monometallic wire bonding and the second join may be a join selected from a group consisting of: i) high melting temperature soldering; ii) thermocompression bonding; iii) ultrasonic bonding; and iv) sintering.

As described above, however, aspects of the disclosure include providing an optimal electrical coupling at each interface, which is highly material dependent. Unimpeded electrical coupling may be accomplished by using matching conductive materials. Thus, as described below, it is highly desirable to select a complementary set of attachment interface material, connector (e.g., terminal) material, and join. General embodiments as described in greater detail herein below include assemblies facilitating optimal connection.

For example, the circuit elements (243, 247) may be selected from circuit elements comprising: i) a Gold (Au) terminal material electrically monometallically attached to at least one of the first attachment interface material of the substrate and the second attachment interface material of the substrate by Au wire; ii) an Aluminum (Al) terminal material electrically monometallically attached to at least one of the first attachment interface material of the substrate and the second attachment interface material of the substrate by Al wire; iii) a Silver (Ag) terminal material electrically monometallically attached to at least one of the first attachment interface material of the substrate and the second attachment interface material of the substrate by Ag wire.

As another example, circuit elements 243 and 247 may be any of: i) a terminal of a Gold (Au) terminal material electrically attached to at least one of the first attachment interface material of the substrate and the second attachment interface material of the substrate by a AuSn solder join; ii) a terminal of a Silver (Ag) terminal material electrically attached to at least one of the first attachment interface material of the substrate and the second attachment interface material of the substrate by a high melting point (HMP) Sn/Ag based solder join; iii) a terminal of a Tin (Sn) terminal material electrically attached to at least one of the first attachment interface material of the substrate and the second attachment interface material of the substrate by a HMP Sn/Ag based solder join; iv) a terminal of a Silver (Ag) terminal material electrically attached to at least one of the first attachment interface material of the substrate and the second attachment interface material of the substrate by a sintered Ag join.

Figure 2C:
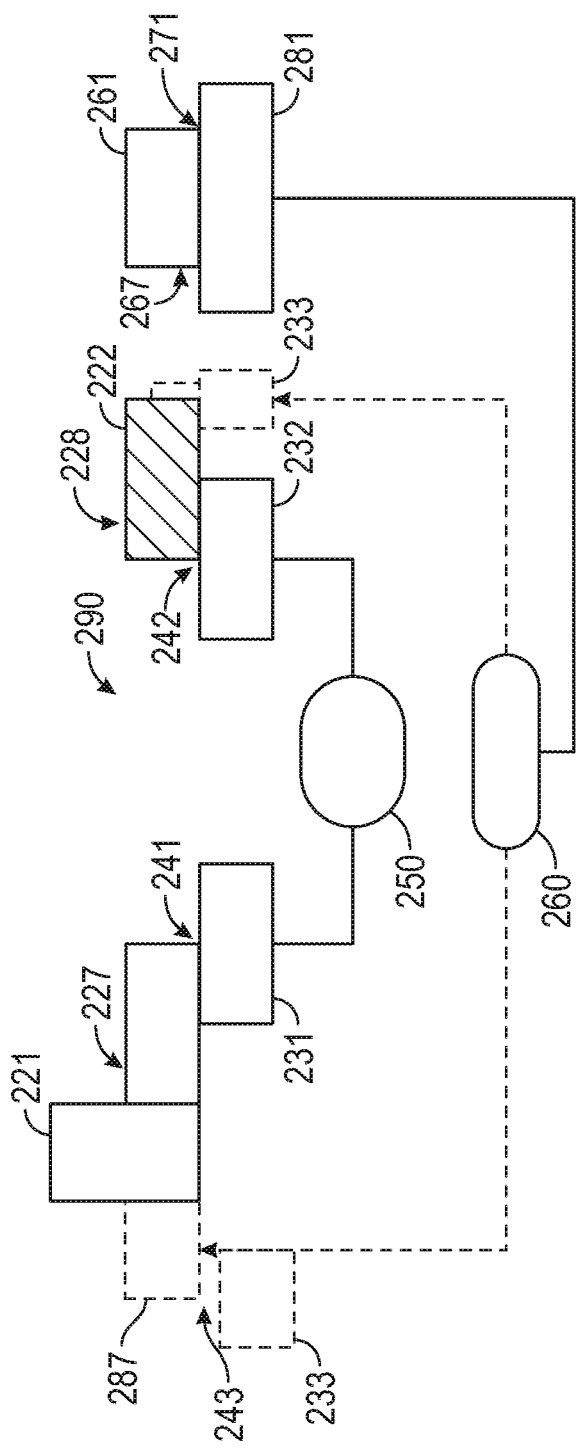
FIG. 2C illustrates a schematic view of another electrical assembly (EA) including attachment interfaces electrically connected by intermediary circuit paths.

FIG. 2C illustrates a schematic view of another electrical assembly (EA) including attachment interfaces electrically connected by intermediary circuit paths. The electrical assembly (EA) 290 includes the elements of electrical assembly (EA) 220. Electrical assembly (EA) 290 also includes a third component 261. The third component 261 has a third connector 267 of a fifth conductor material permanently electrically coupled to the third attachment interface 281 by a third electrical join 271. The third attachment interface 281 may comprise a third attachment interface material different than the first attachment interface material and the second attachment interface material. The operative coupling is implemented by a first attachment interface 231 electrically connected to a second attachment interface 232 by substrate connection element 250. The third component 261 may be operatively electrically coupled to at least one of first component 221 and second component 222 through substrate connection element 260 which is joined to at an additional connector 287 permanently electrically coupled to an additional attachment interface 233 by an additional electrical join 243.

Substrates configured for use in such connections may be prepared by sequential physical vapor deposition, although the advantages of other deposition means may recommend them for use in specific applications. See U.S. Pat. No. 4,227,039 to Shibasaki et al, U.S. Pat. No. 4,596,762 to Gruner, U.S. Pat. No. 4,835,593 to Arnold at al, and U.S. Pat. No. 6,197,435 to Tsujimura et al. Example sequential physical vapor deposition substrates may have deposition layers comprising at least one adhesion layer, at least one barrier layer, and at least one conductor layer.

The substrate may comprise a number of functional layers. The functional layers may be electrical conductor materials. It is desirable for the first conductor material to be Gold (Au) and the second conductor material to be a metal selected from the group consisting of: i) Silver (Ag), and ii) Aluminum (Al). Alternatively, the first conductor material may be Silver (Ag) and the second conductor material may be Aluminum (Al). The intermediary circuit path may be an additional conductor material different than the first conductor material and the second conductor material. The additional conductor material may be multi-metallic.

Figure 3:
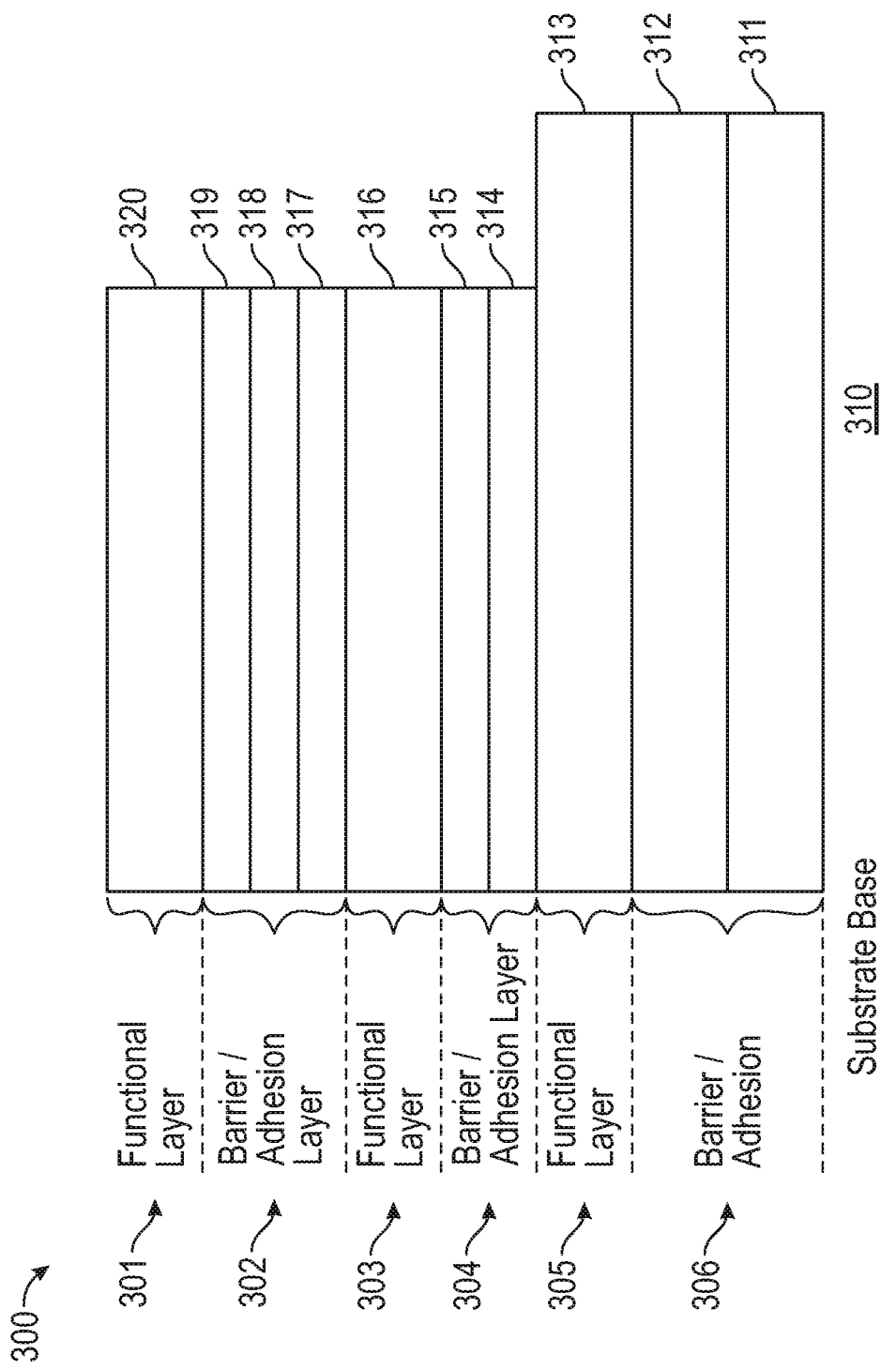
FIG. 3 illustrates a deposition view of a substrate including attachment interfaces configured for electrical connection with one another by an intermediary circuit path.

FIG. 3 illustrates a deposition view of a substrate including attachment interfaces configured for electrical connection with one another by an intermediary circuit path. The substrate includes a number of functional layers 301, 303, 305 which are separated by barrier/adhesion layers 302, 304. One or more material layers may be used in building the structure of each of layers 301 to 305. Material layers may be referred to in order of their deposition. As described above, in combining the functional layers configured for an optimal join in the same substrate, it may be beneficial to use two different monometallic conductor materials for the respective joins. The particular order of the metal stack may thus be configured to ensure the integrity of the stack as a whole.

It may be desirable for the substrate to have a first Tungsten-Titanium layer, a second Tungsten-Titanium layer, a Palladium layer, and a Gold layer between the Palladium layer and at least one of: i) the first Tungsten-Titanium layer, and ii) a second Tungsten-Titanium layer.

It may be desirable for the substrate to have a first Tungsten-Titanium layer, a second Tungsten-Titanium layer, a Titanium layer, and an Aluminum layer between the Titanium layer and at least one of: i) the first Tungsten-Titanium layer, and ii) a second Tungsten-Titanium layer.

It may be desirable for the substrate to have a first Titanium layer adjacent to a first Tungsten-Titanium barrier layer adjacent to a Palladium layer adjacent to a Gold layer adjacent to a second Tungsten-Titanium barrier layer adjacent a second Titanium layer adjacent an Aluminum layer adjacent a third Tungsten-Titanium barrier layer adjacent a third Titanium layer adjacent a Nickel layer adjacent a Silver layer.

First deposition layer 311 is deposited on the substrate base (e.g., Aluminum Oxide), and a second deposition layer 312 is deposited on the first layer. Together, the first and second deposition layers make up barrier/adhesion layer 305. In one example, the first layer is an adhesion layer and the second layer is a barrier layer. An additional layer of Titanium of up to 500 Angstroms may also be used in the barrier/adhesion layers. Functional layer 313 comprises a third deposition layer 313 deposited on the second layer.

Example adhesion layer materials include Tantalum Nitride (TaN) at 250-1000 Angstroms, Nickel Chromium alloy (NiCr) at 250-1000 Angstroms, Chromium (Cr) at 250-750 Angstroms, Titanium (Ti) at 500-1000 Angstroms, and Tungsten-Titanium alloy (W:Ti) at 250-10000 Angstroms. Example barrier layer materials include Chromium (Cr) at 250-750 Angstroms, Tungsten-Titanium alloy (W:Ti) at 250-1000 Angstroms, Nickel (Ni) at 1000-15000 Angstroms, and Palladium (Pd) at 1000-4000 Angstroms. Example functional layer materials include Gold (Au) at 2000 to 8000 Angstroms, Aluminum (Al) at 10000 to 50000 Angstroms, and Silver (Ag) at 2000 to 8000 Angstroms.

Fourth deposition layer 314 (adhesion layer) is deposited on layer 313. Fifth deposition layer 315 (barrier layer) is deposited on layer 314. Together layer 314 and 315 make up barrier adhesion layer 303. Deposition layer 316 is a conductive material deposited on layer 315.

Deposition layer 317 (adhesion layer) is deposited on layer 316. Deposition layer 318 (barrier layer) is deposited on layer 314. Deposition layer 319 (adhesion layer) is deposited on layer 318. Together layer 317, 318 and 319 make up barrier adhesion layer 301. Deposition layer 320 is a conductive material deposited on layer 319.

In one example, layers are deposited in the following order on the substrate:

1. Titanium layer 0-500 Angstrom thick
2. Tungsten-Titanium (80/20) layer 300-1000 Angstrom thick
3. Palladium layer 1000-3000 Angstrom thick
4. Gold layer 3000-60000 Angstrom thick
5. Tungsten-Titanium (80/20) barrier layer at least 3500 Angstrom thick
6. Titanium layer 0-500 Angstrom thick
7. Aluminum layer 20000-40000 Angstrom thick
8. Tungsten-Titanium (80/20) barrier layer at least 3500 Angstrom thick,
9. Titanium layer 0-500 Angstrom thick
10. Nickel layer 3000-10000 Angstrom thick
11. Silver layer 3000-60000 Angstrom thick.

Aspects of the above disclosure may be deployed in devices employing various other accommodations for downhole environments. For example, techniques in the present disclosure may be used with those of US patent application publication no. 2018/042,111 to DiFoggio et al., incorporated by reference herein in its entirety.

The term "conveyance device" as used above means any device, device component, combination of devices, media and/or member that may be used to convey, house, support or otherwise facilitate the use of another device, device component, combination of devices, media and/or member. Exemplary non-limiting conveyance devices include drill strings of the coiled tube type, of the jointed pipe type and any combination or portion thereof. Other conveyance device examples include casing pipes, wirelines, wire line sondes, slickline sondes, drop shots, downhole subs, BHA's, drill string inserts, modules, internal housings and substrate portions thereof, self-propelled tractors. As used above, the term "sub" refers to any structure that is configured to partially enclose, completely enclose, house, or support a device. The term "information" as used above includes any form of information (Analog, digital, EM, printed, etc.). The term "processor" or "information processing device" herein includes, but is not limited to, any device that transmits, receives, manipulates, converts, calculates, modulates, transposes, carries, stores or otherwise utilizes information. An information processing device may include a microprocessor, resident memory, and peripherals for executing programmed instructions. The processor may execute instructions stored in computer memory accessible to the processor, or may employ logic implemented as field-programmable gate arrays ('FPGAs'), application-specific integrated circuits ('ASICs'), other combinatorial or sequential logic hardware, and so on. Thus, configuration of the processor may include operative connection with resident memory and peripherals for executing programmed instructions.

Method embodiments may include conducting further operations in the earth formation in dependence upon the formation resistivity information, the logs, estimated parameters, or upon models created using ones of these. Further operations may include at least one of: i) extending the borehole; ii) drilling additional boreholes in the formation; iii) performing additional measurements on the formation; iv) estimating additional parameters of the formation; v) installing equipment in the borehole; vi) evaluating the formation; vii) optimizing present or future development in the formation or in a similar formation; viii) optimizing present or future exploration in the formation or in a similar formation; ix) evaluating the formation; and x) producing one or more hydrocarbons from the formation.

Aspects of the present disclosure relate to modeling a volume of an earth formation. The model of the earth formation generated and maintained in aspects of the disclosure may be implemented as a representation of the earth formation stored as information. The information (e.g., data) may be stored on a non-transitory machine-readable medium, transmitted, and rendered (e.g., visually depicted) on a display.

"Large Scale Integration (LSI)," as used herein, refers to systems with an IC having at least one hundred logic gates. "Very Large Scale Integration (VLSI)," as used herein, refers to systems with an IC having at least one thousand logic gates. "Ultra Large Scale Integration (VLSI)," as used herein, refers to systems with an IC having at least one million logic gates.

"Significantly electrically conductive," as defined herein refers to materials having a resistivity less than $10^{-5}$ ohm-meters. "Uninterrupted electrical connection," as used herein, refers to a connection with identical or better connectivity than a good solder connection. "Permanently electrically coupled," as used herein, refers to a connection that is non-temporary and is not intended to be broken.

While the foregoing disclosure is directed to the one mode embodiments of the disclosure, various modifications will be apparent to those skilled in the art. It is intended that all variations be embraced by the foregoing disclosure.

What is claimed is:

1. An apparatus for performing well logging in a borehole intersecting an earth formation, the apparatus comprising:
   a carrier conveyable in the borehole;
   a tool disposed on the carrier comprising:
   a substrate including a first attachment interface electrically connected to a second attachment interface by a substrate connection element, wherein the first attachment interface comprises a first attachment interface material and the second attachment interface comprises a second attachment interface material different than the first attachment interface material;
   at least two circuit elements selected from circuit elements comprising: i) a terminal of a Gold (Au) terminal material electrically attached to at least one of the first attachment interface material of the substrate and the second attachment interface material of the substrate by a AuSn solder join; ii) a terminal of a Silver (Ag) terminal material electrically attached to at least one of the first attachment interface material of the substrate and the second attachment interface material of the substrate by a high melting point (HMP) Sn/Ag based solder join; iii) a terminal of a Tin (Sn) terminal material electrically attached to at least one of the first attachment interface material of the substrate and the second attachment interface material of the substrate by a HMP Sn/Ag based solder join; iv) a terminal of a Silver (Ag) terminal material electrically attached to at least one of the first attachment interface material of the substrate and the second attachment interface material of the substrate by a sintered Ag join.

2. The apparatus of claim 1 wherein at least one of the first attachment interface and the second attachment interface comprises an electrically conductive contact surface.

3. The apparatus of claim 1 wherein, for at least one circuit element of the at least two circuit elements, the circuit element terminal corresponding to the at least one circuit element is monometallic with the attachment interface corresponding to the at least one circuit element.

4. The apparatus of claim 3 wherein, for at least one circuit element of the at least two circuit elements, the join corresponding to the at least one circuit element is an electrically conductive join that is monometallic with the attachment interface corresponding to the at least one circuit element and the circuit element terminal corresponding to the at least one circuit element.

5. The apparatus of claim 1 wherein the substrate connection element comprises an additional conductor material different than the first attachment interface material and the second attachment interface material.

6. The apparatus of claim 5 wherein the additional conductor material is at least one of: i) multi-metallic; and ii) composite.

7. The apparatus of claim 1 wherein the substrate comprises a sequential physical vapor deposition material having deposition layers comprising at least one adhesion layer, at least one barrier layer, and at least one conductor layer.

8. The apparatus of claim 1 wherein the substrate comprises a first Tungsten-Titanium layer, a second Tungsten-Titanium layer, a Palladium layer, and a Gold layer between the Palladium layer and at least one of: i) the first Tungsten-Titanium layer, and ii) a second Tungsten-Titanium layer.

9. The apparatus of claim 1 wherein the substrate comprises a first Tungsten-Titanium layer, a second Tungsten-Titanium layer, a Titanium layer, and an Aluminum layer between the Titanium layer and at least one of: i) the first Tungsten-Titanium layer, and ii) a second Tungsten-Titanium layer.

10. The apparatus of claim 1 wherein the substrate comprises deposited layers including a first Titanium layer followed by a first Tungsten-Titanium barrier layer followed by a Palladium layer followed by a Gold layer followed by a second Tungsten-Titanium barrier layer followed by a second Titanium layer followed by an Aluminum layer followed by a third Tungsten-Titanium barrier layer followed by a third Titanium layer followed by a Nickel layer followed by a Silver layer.

11. An apparatus for performing well logging in a borehole intersecting an earth formation, the apparatus comprising:
   a carrier conveyable in the borehole;

a tool disposed on the carrier comprising:
a substrate including a first attachment interface electrically connected to a second attachment interface by a substrate connection element, wherein the first attachment interface comprises a first attachment interface material and the second attachment interface comprises a second attachment interface material different than the first attachment interface material;
at least two circuit elements selected from circuit elements comprising: i) a Gold (Au) terminal material electrically monometallically attached to at least one of the first attachment interface material of the substrate and the second attachment interface material of the substrate by Au wire; ii) an Aluminum (Al) terminal material electrically monometallically attached to at least one of the first attachment interface material of the substrate and the second attachment interface material of the substrate by Al wire; iii) a Silver (Ag) terminal material electrically monometallically attached to at least one of the first attachment interface material of the substrate and the second attachment interface material of the substrate by Ag wire.

12. The apparatus of claim 11 wherein at least one of the first attachment interface and the second attachment interface comprises an electrically conductive contact surface.

13. The apparatus of claim 11 wherein the substrate connection element comprises an additional conductor material different than the first attachment interface material and the second attachment interface material.

14. The apparatus of claim 13 wherein the additional conductor material is at least one of: i) multi-metallic; and ii) composite.

15. The apparatus of claim 11 wherein the substrate comprises a sequential physical vapor deposition material having deposition layers comprising at least one adhesion layer, at least one barrier layer, and at least one conductor layer.

16. The apparatus of claim 11 wherein the substrate comprises a first Tungsten-Titanium layer, a second Tungsten-Titanium layer, a Palladium layer, and a Gold layer between the Palladium layer and at least one of: i) the first Tungsten-Titanium layer, and ii) a second Tungsten-Titanium layer.

17. The apparatus of claim 11 wherein the substrate comprises a first Tungsten-Titanium layer, a second Tungsten-Titanium layer, a Titanium layer, and an Aluminum layer between the Titanium layer and at least one of: i) the first Tungsten-Titanium layer, and ii) a second Tungsten-Titanium layer.

18. A method of performing well logging in a borehole intersecting an earth formation, the method comprising:
conveying a carrier in the borehole, the carrier having disposed thereon a tool comprising:
a substrate including a first attachment interface electrically connected to a second attachment interface by a substrate connection element, wherein the first attachment interface comprises a first attachment interface material and the second attachment interface comprises a second attachment interface material different than the first attachment interface material;
at least two circuit elements selected from circuit elements comprising: i) a terminal of a Gold (Au) terminal material electrically attached to at least one of the first attachment interface material of the substrate and the second attachment interface material of the substrate by a AuSn solder join; ii) a terminal of a Silver (Ag) terminal material electrically attached to at least one of the first attachment interface material of the substrate and the second attachment interface material of the substrate by a high melting point (HMP) Sn/Ag based solder join; iii) a terminal of a Tin (Sn) terminal material electrically attached to at least one of the first attachment interface material of the substrate and the second attachment interface material of the substrate by a HMP Sn/Ag based solder join; iv) a terminal of a Silver (Ag) terminal material electrically attached to at least one of the first attachment interface material of the substrate and the second attachment interface material of the substrate by a sintered Ag join; and
performing well logging, including sending signals over the at least two circuit elements.

* * * * *